(12) United States Patent
Razafimandimby et al.

(10) Patent No.: US 7,218,181 B2
(45) Date of Patent: May 15, 2007

(54) INTEGRABLE AMPLITUDE-LOCKED LOOP INCLUDING AN ACOUSTIC RESONATOR

(75) Inventors: Stephane Razafimandimby, Lille (FR); Andreia Cathelin, Laval (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/025,598

(22) Filed: Dec. 29, 2004

(65) Prior Publication Data
US 2005/0189997 A1    Sep. 1, 2005

(30) Foreign Application Priority Data
Dec. 29, 2003  (FR)  .................... 03 15480
Apr. 2, 2004   (FR)  .................... 04 03494

(51) Int. Cl.
*H03B 5/32*       (2006.01)
(52) U.S. Cl. .................... 331/107 A; 331/16; 455/313; 455/344
(58) Field of Classification Search ................ 331/167, 331/177 V, 107 A, 16; 455/344, 313
See application file for complete search history.

(56) References Cited

U.S. PATENT DOCUMENTS

| | | | |
|---|---|---|---|
| 5,043,681 A | 8/1991 | Tanemura et al. | 331/107 A |
| 6,950,639 B2 * | 9/2005 | Gogolla et al. | 455/196.1 |
| 7,030,718 B1 | 4/2006 | Scherer | 333/188 |
| 2001/0028277 A1 | 10/2001 | Northam | 331/34 |
| 2004/0227578 A1 * | 11/2004 | Hamalainen | 331/107 A |
| 2005/0266823 A1 | 12/2005 | Cathelin et al. | 455/344 |

FOREIGN PATENT DOCUMENTS

| | | |
|---|---|---|
| FR | 2 455 816 | 11/1980 |
| GB | 615841 | 1/1949 |
| WO | WO 02/25813 A1 | 3/2002 |

OTHER PUBLICATIONS

Akbari-Dilmaghani, R., et al., "A High Q RF CMOS Differential Active Inductor," in Proceedings of the IEEE Electronics, Circuits and Systems Int'l. Conference, Lisboa, Portugal, Sep. 7-10, 1998, pp. 157-160.
Koroglu, M., et al., "A 1.9Ghz Image-Reject Front-End with Automatic Tuning in a 0.15μm CMOS Technology," in Proceedings of the IEEE Int'l. Solid State Circuits Conference, San Francisco, CA, Feb. 9-13, 2003, pp. 1-10.

* cited by examiner

*Primary Examiner*—Arnold Kinkead
(74) *Attorney, Agent, or Firm*—Lisa K. Jorgenson; Dennis M. de Guzman; Seed IP Law Group PLLC

(57) ABSTRACT

An amplitude-locked loop (ALL) includes: a comparator circuit having a first input, a second input and an output, said first input receiving an electric reference signal; a loop filter having an input connected to said output of said comparator circuit and having an output generating an electric control signal (Vtune); a circuit generating an electric signal to be controlled, transmitted to said second input of said comparator circuit. The circuit comprises an acoustic resonator having a BAW-type resonator having a first and second resonant frequencies and associated with a first inductive partner element for removing said second resonant frequency and with a second capacitive partner element for tuning said first resonant frequency, said at least first resonator component being adjustable via said electric control signal (Vtune).

29 Claims, 4 Drawing Sheets

INTEGRABLE AMPLITUDE-LOCKED LOOP INCLUDING AN ACOUSTIC RESONATOR

BACKGROUND OF THE INVENTION

1. Field of the Invention

The present disclosure generally relates to microelectronic circuits and more particularly but not exclusively to an amplitude-locked loop integrable into an integrated circuit and equipped with an acoustic resonator.

2. Description of the Related Art

Amplitude-locked loops are particularly useful circuits in many applications.

They are particularly found in communication systems, and in particular in mobile telephony where integration of the components forming the transmitter and the receiver of a mobile communication system is further developing.

Document "A 1.9 GHZ IMAGE-REJECT FRONT-END WITH AUTOMATIC TUNING IN A 0.15UM CMOS TECHNOLOGY," Mustafa H. Koroglu et al., 2003 IEEE International Solid-State Circuits Conference, 0-7803-7707-9/03 describes a control technique using a loop of the ALL type.

BRIEF SUMMARY OF THE INVENTION

With the development of the most recent techniques as regards communication, and in particular in mobile telephony, one seeks to design amplitude-locked loops that would be more efficient than known loops—based on passive components and transistors—and would however allow complete integration on a single silicon substrate.

Such is addressed by an embodiment of the present invention.

One embodiment of the present invention provides a powerful amplitude-locked loop, having an acoustic resonator and that can be integrated into a semiconductor product.

Accordingly, one embodiment provides an amplitude-locked loop (ALL) comprising:

a comparator circuit having a first input, a second input and an output, said first input receiving an electric reference value;

a loop filter having an input connected to said output of said comparator circuit and having an output generating an electric control signal (Vtune);

a circuit generating an electric signal to be controlled and transmitted to said second input of said comparator circuit.

The circuit according to one embodiment of the invention comprises a tunable resonator component including a BAW-type acoustic resonator having a resonant frequency and an antiresonant frequency, said resonator being associated with a first partner element of the inductive type set close to said resonant and antiresonant frequencies and a second partner element of the capacitive type making it possible to adjust said first resonant frequency, said resonator component being tunable via said electric control signal (Vtune).

In one embodiment, the first partner element is an active inductor made up of a gyrator and a capacitive element that can be variable or not variable.

In one embodiment, said capacitive element is a varactor that can be adjusted by said electric control voltage.

In another embodiment, the gyrator comprises a pair of trans-conductance amplifiers whose bias point is set by said control voltage.

Thus, a very powerful amplitude-locked loop is obtained, which is based on the high quality coefficient of the acoustic resonator and is entirely integrable.

BRIEF DESCRIPTION OF THE SEVERAL VIEWS OF THE DRAWINGS

Other features of one or more embodiments of the invention will appear when reading the following description and drawings, only given by way of nonrestrictive examples. In the accompanying drawings.

DETAILED DESCRIPTION

Embodiments of an integrable amplitude-locked loop including an acoustic resonator are described herein. In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

An embodiment of the invention allowing complete integration of a phase locked loop with a BAW-type component resonator will now be described.

To this end, a new acoustic component is used, hereafter referred to as a Tunable resonator component (TRC)—as described in the French patent application No. 0315480 (ref. 03-GR1-267) filed on Dec. 29, 2003, and the main characteristics of which will be reminded hereinafter, for clarity purposes.

To this end, an acoustic resonator based on a dielectric medium arranged on a reflecting element is used, such as a Bragg mirror or a receiver for example. Layers having different acoustic properties and different dielectric constants are stacked on a Surface substrate. Such an acoustic element is known as a Surface Mounted Resonator (SMR).

Alternatively, the resonator could be of the Film Bulk Acoustic Resonator type (FBAR), namely a resonator located above a cavity to allow the reflection of acoustic waves and to avoid damping thereof.

Figure 1A:
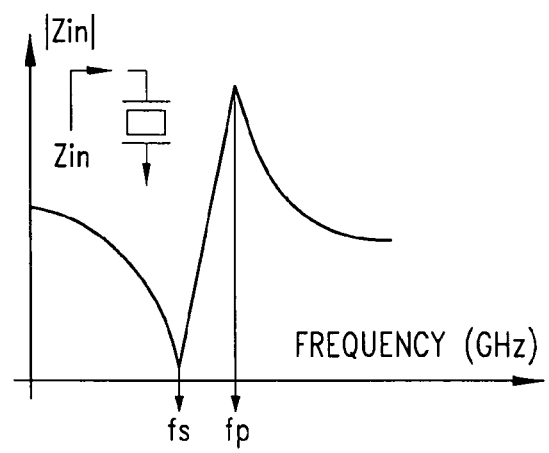
FIG. 1a illustrates an impedance curve of an example BAW-type acoustic resonator.
Figure 1B:
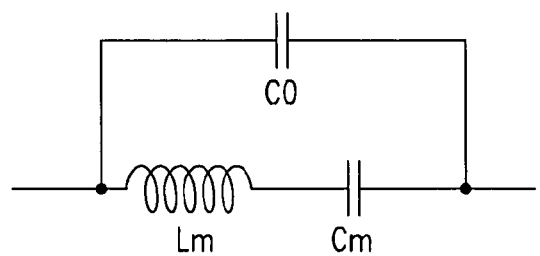
FIGS. 1b and 1c show the equivalent electric diagram of an example BAW-type acoustic resonator, respectively in series and parallel.
Figure 1C:
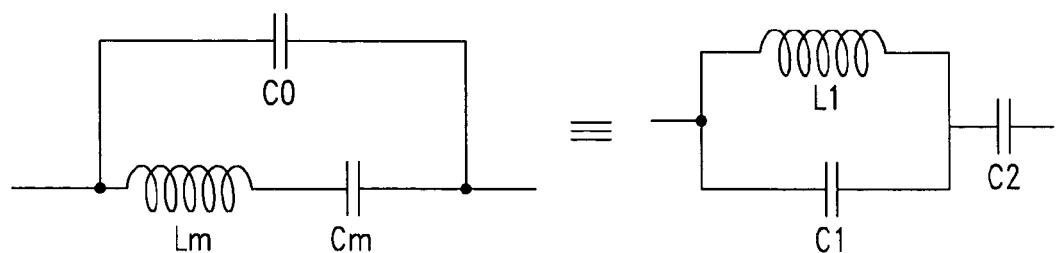

Acoustic resonators have two very close resonant frequencies, $f_s$ (series) and $f_p$ (parallel) respectively, as illustrated in FIG. 1. Referring to an equivalent electric diagram such as the one shown in FIG. 1b, that amounts to considering two LC-type resonator circuits, series and parallel respectively.

In the known approach, both resonant circuits are used simultaneously for filtering purpose, as it is the case in document "RF MEMS CIRCUIT DESIGN FOR WIRELESS COMMUNICATIONS," Hector J. De Los Santos, Artech House, ISBM 1-58033 329-9, 2002, p. 163 and following, for example.

On the contrary, in the new proposed approach, the TRC comprises a BAW-type resonator associated with at least two partner elements and, in an embodiment, with a first inductive partner element, variable or not, active or passive, and with a second capacitive partner element, generally variable.

It has been noted that there is a great advantage in choosing a first partner element that is inductive and set close to the resonant and antiresonant frequencies. In a particular embodiment, a spiral inductor integrated directly on the silicon substrate is used.

Alternatively, the first partner element is a variable inductor set in the vicinity of the resonant and antiresonant frequencies, according to an electric signal Vtune.

The second partner element is a capacitive element and it generally varies a according to an electric value, for example voltage Vtune.

By controlling said electric voltage Vtune it is possible to considerably modify the characteristics of the tunable resonator component composed of the acoustic resonator and its two partner elements.

It can be observed that the combination of partner elements chosen as mentioned above makes it possible to adjust the characteristics of the TRC to a large extent, and in particular the characteristics of any integrated electronic circuit comprising such TRC, without affecting too much the overall performance of this circuit (resonant and antiresonant frequencies, quality factor).

Then, inaccuracies in the manufacturing process and temperature sensitivity can be corrected and it is even possible to have a means for tuning the new acoustic component.

Figure 2A:
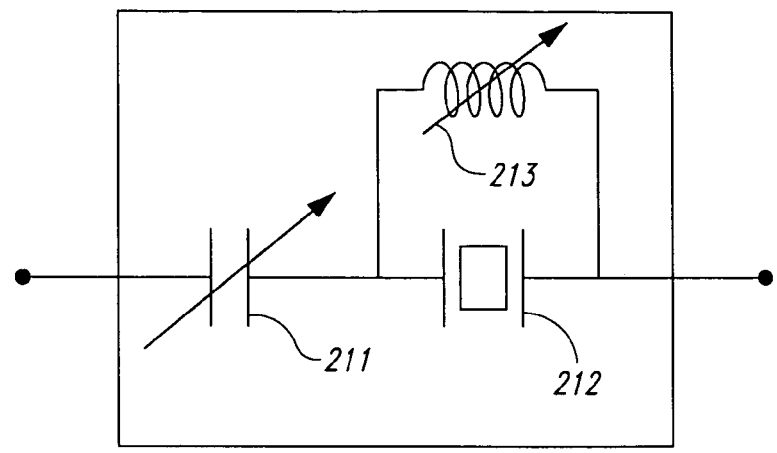
FIGS. 2a and 2b illustrate two embodiments of a tunable acoustic component that is controlled by an electric signal.

FIG. 2a illustrates a first embodiment of a TRC in which the series resonance of a BAW resonator 212 is acted upon. To this end an inductor 213 is connected in parallel; inductor 213 being variable so that it can be adjusted to start resonating with the parallel capacity of the resonator, close to frequency fp or in the vicinity of this frequency.

It is then possible to act on the series resonance and to control the resonant frequency by means of a capacitive tuning element 211.

Figure 2B:
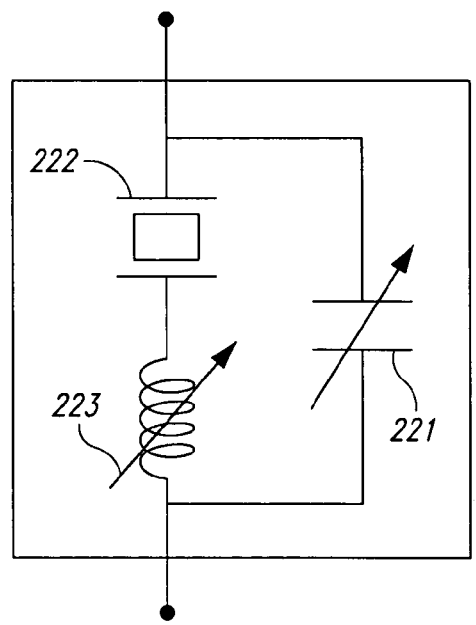

FIG. 2b corresponds to a second embodiment of a TRC in which the parallel resonance of a BAW resonator 222 is now acted upon. To this end, this time an inductor 223, is mounted in series with resonator 222, inductor 223 is variable so that it can be adjusted to start resonating with the equivalent series capacity (C2) close to frequency fs of the resonator of FIG. 1c, or in the vicinity of this frequency. Then, a capacitive tuning element (221) is connected in parallel with both series elements, to interact with the parallel resonance of resonator 222 and set it to frequency $f_p$.

Thus, through the combined action of partner elements 221 and 223, it is possible to adjust the operational frequency—within a broad range—by means of tuning element, 211 or 221 according to the case.

Thus, there is a true co-operation between tuning element 211 (or 221) and inductor 213 (resp. 223) which, by its action in the vicinity of both resonant and antiresonant frequencies of the acoustic resonator, reinforces the capacitive tuning effect of 211 (resp. 221).

It results in a new tunable resonator component, having a BAW resonator with a high quality coefficient, associated with its two partner elements.

This tunable resonator component provides great flexibility. It is perfectly integrable into a semiconductor product and it is particularly well-suited for the design of an amplitude-locked loop, based on the strong quality coefficient of the acoustic resonator, associated with both its partner elements.

Figure 3:
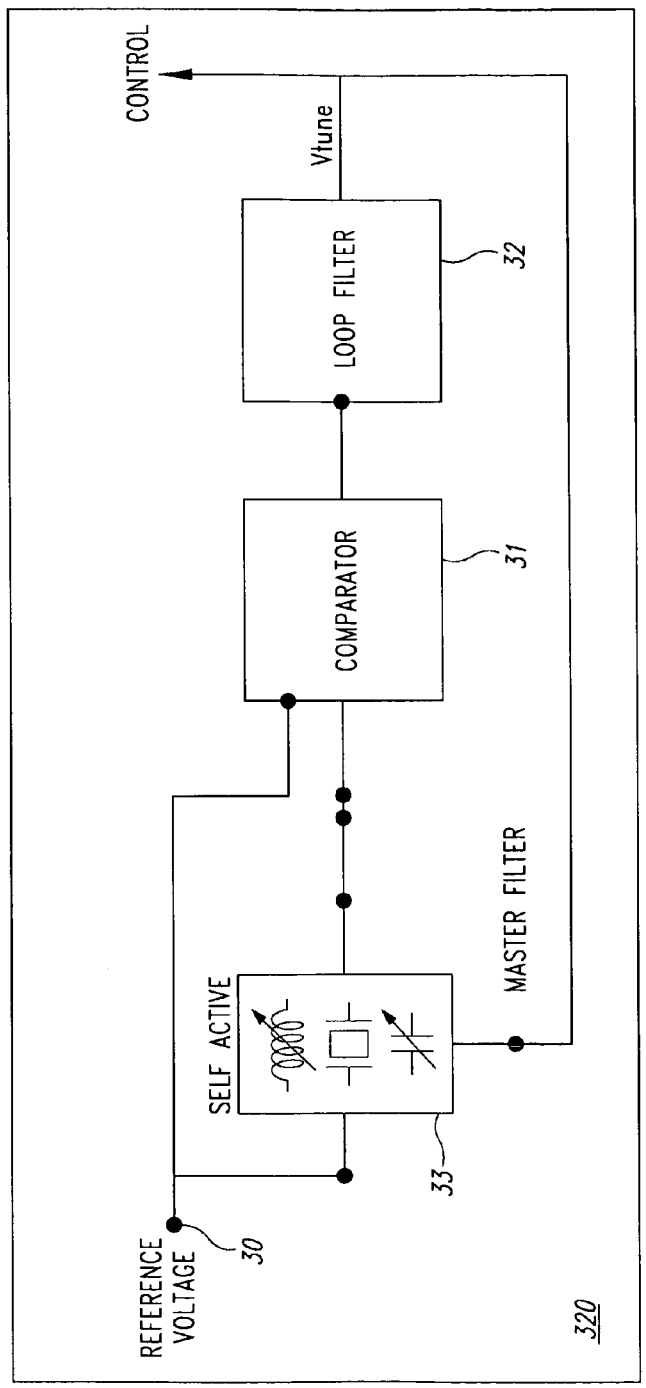
FIG. 3 illustrates one embodiment of an amplitude-locked loop integrating the tunable acoustic resonator of FIGS. 2a and 2b.

FIG. 3 illustrates an amplitude-locked loop integrating a resonator component, according to an embodiment of the invention.

To this end, the circuit comprises a voltage comparator 31 having a first input 30 receiving a reference voltage that will be as stable as possible. Comparator 31 has a second input receiving a voltage resulting from the operation of a linear phase response circuit, of the filter type, using a tunable TRC component having two partner elements, as described previously.

Comparator 31 outputs an error that is filtered by a loop filter 32—generally a low-pass filter—which generates a control voltage Vtune then transmitted to control electrodes of TRC component 33.

Figure 4A:
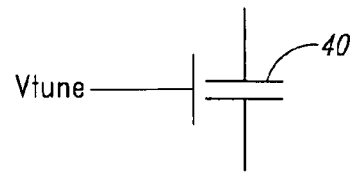
FIGS. 4a and 4b describe control of the component by means of a varactor and an active inductor, respectively.
Figure 4B:
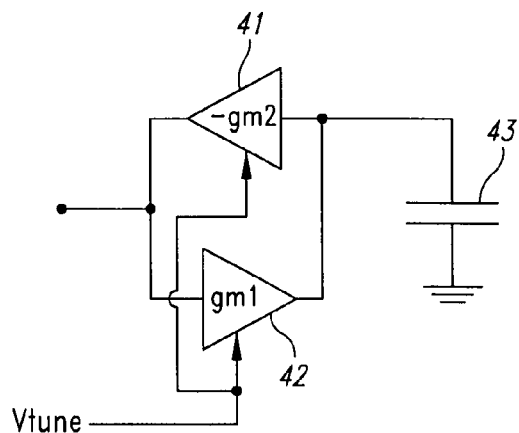

In one embodiment, control voltage Vtune is transmitted to the control of a varactor, as element 40 in FIG. 4a, which is used to carry out the capacitive partner element of BAW resonator. Alternatively, the control voltage could be transmitted to the control of the polarization point of a gyrator-capacitor unit in order to produce a controlled active inductor, as shown in FIG. 4b where a pair of transconductance amplifiers 41 and 42 are mounted head-to-tail and drive a capacitor 43.

Figure 4C:
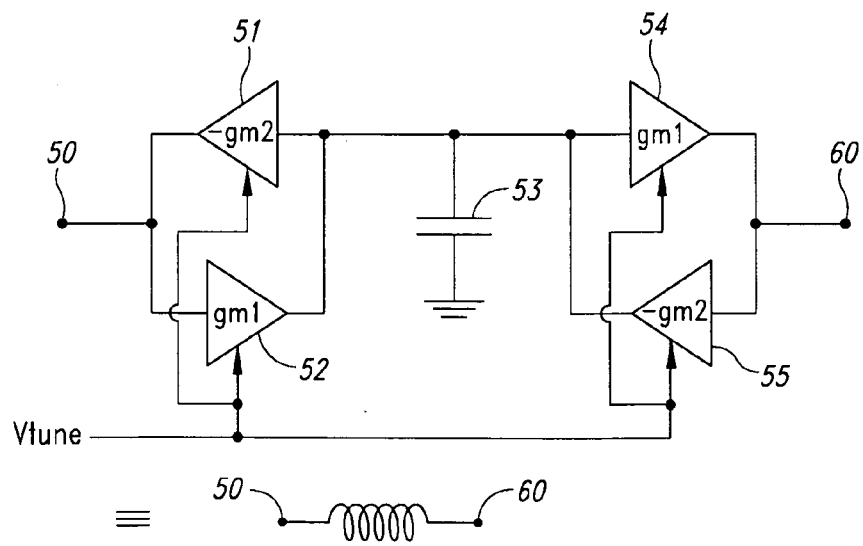
FIG. 4c illustrates an embodiment of a floating variable active inductor.

FIG. 4c illustrates a design of a variable floating active inductance that could be used to carry out a variable floating inductive element between two electrodes 50 and 60. To this end, a first gyrator formed of two head-to-tail transconductance amplifiers 51 and 52 is inserted between electrode 50 and capacitor 53, the second amplifier inducing a change in polarity. Similarly, a second gyrator formed of two head-to-tail transconductance amplifiers 54 and 55 is inserted between electrode 60 and capacitor 53, with the second amplifier inducing polarity change.

Whatever the method, thus the operation point of the variable resonator component is controlled, within the amplitude-locked loop.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An amplitude-locked loop (ALL), comprising:
   a comparator circuit having a first input, a second input and an output, said first input receiving an electric reference signal;
   a loop filter having an input connected to said output of said comparator circuit and having an output generating an electric control signal; and
   a circuit to generate an electric signal to be controlled, transmitted to said second input of said comparator circuit, said circuit realizing a linear phase response filter;
   wherein said circuit includes an acoustic resonator component with a BAW-type resonator having a resonant frequency and an antiresonant frequency, said resonator being associated with a first inductive partner element set in a vicinity of said resonant and antiresonant frequencies and a second capacitive partner element making it possible to adjust said resonant frequency, said resonator component being tuned via said electric control signal.

2. The amplitude-locked loop according to claim 1 wherein said BAW-type resonator is located on a same silicon substrate as said loop.

3. The amplitude-locked loop according to claim 1 wherein said first partner element is an active inductor made up of a gyrator and a capacitive element.

4. The amplitude-locked loop according to claim 3 wherein said capacitive element is a varactor that can be adjusted by said electric control signal.

5. The amplitude-locked loop according to claim 3 wherein said electric control signal is transmitted to the gyrator to set its bias point.

6. An apparatus, comprising:
   a comparator having a first input terminal to receive a reference signal, a second input terminal, and an output terminal;
   a filter having an input terminal coupled to the output terminal of the comparator and having an output terminal to provide a control signal; and
   a unit having an output terminal coupled to the input terminal of the comparator and having an input terminal coupled to the output terminal of the filter to receive the control signal, the unit including a resonator component having:
   a resonator having first and second frequencies;
   a first element coupled to the resonator and having a characteristic that can set the first element to a vicinity of first frequency of the resonator to substantially cancel the first frequency; and
   a second element coupled to the resonator and having a characteristic that can be varied to tune the resonator component to a vicinity of the second frequency in response to the control signal,
   wherein said first and second frequencies of the resonator respectively include series and parallel resonant frequencies, wherein the first element coupled to the resonator includes an inductive element coupled in series with the resonator, and wherein said characteristic of the first element includes an inductance of the inductive element that can set the inductive element to the vicinity of the series resonant frequency to cancel out the series resonant frequency of the resonator, so as to reinforce a tuning effect on the parallel resonant frequency by the second element in response to the control signal, and
   wherein the comparator, filter, and unit are part of an amplitude-locked loop.

7. The apparatus of claim 6 wherein the inductance of the inductive element can be set in response to the control signal.

8. The apparatus of claim 7 wherein the inductive element includes a unit having a gyrator coupled to a capacitive element, the unit being responsive to the control signal to provide a controllable active inductor.

9. The apparatus of claim 7 wherein the inductive element includes a unit having a capacitive element coupled to a plurality of gyrators, the unit being responsive to the control signal to provide a variable floating inductive element.

10. The apparatus of claim 6 wherein the second element having the characteristic that can be varied comprises a capacitive element having a capacitance that can be varied in response to the control signal.

11. The apparatus of claim 10 wherein the capacitive element comprises a varactor that is controllable by the control signal.

12. The apparatus of claim 6 wherein the comparator, filter, and unit comprise part of an amplitude-locked loop that is arranged on a same silicon semiconductor substrate as the resonator.

13. The apparatus of claim 6 wherein said amplitude-locked loop is arranged on a same silicon semiconductor substrate as the resonator.

14. A system, comprising:
   a wireless device;
   a semiconductor product included with the wireless device; and
   an amplitude-locked loop provided in the semiconductor product, the amplitude-locked loop including:
   a resonator having first and second frequencies;
   a first element coupled to the resonator and that can be set close to the first frequency to substantially cancel the first frequency; and
   a second element coupled to the resonator and having a terminal to receive a control signal to adjust a characteristic of the second element to allow tuning to the second frequency,
   wherein the first and second frequencies respectively include parallel and series resonant frequencies wherein the first element coupled to the resonator includes an inductive element coupled in parallel with the resonator, and wherein the inductive element has an inductance that can set the inductive element to a vicinity of the parallel resonant frequency to cancel out the parallel resonant frequency of the resonator, so as to reinforce a tuning effect on the series resonant frequency by the second element in response to the control signal.

15. The system of claim 14 wherein the amplitude-locked loop further includes:
   a comparator having a first input terminal to receive a reference signal, a second input terminal, and an output terminal;
   a filter having an input terminal coupled to the output terminal of the comparator and having an output terminal to provide the control signal; and
   a unit having an output terminal coupled to the input terminal of the comparator and having an input terminal coupled to the output terminal of the filter to receive the control signal, the unit including the resonator and the first and second elements.

16. The system of claim 14 wherein the inductance of said inductive element can be set in response to the control signal.

17. The system of claim 14 wherein the second element comprises a capacitive element having a capacitance that can be varied in response to the control signal to tune the unit to substantially the second frequency.

18. A system including a resonator having first and second frequencies, the system comprising:
 first and second element means for tuning to the first and second frequencies of the resonator, respectively;
 means for setting a characteristic of the first element means for tuning the first element means close to the first frequency for substantially canceling the first frequency of the resonator;
 means for using a control signal provided to the second element means for adjusting tuning to the second frequency of the resonator; and
 amplitude-locked loop means for generating a signal to be controlled, the amplitude-locked loop means including the resonator, the first and second element means, the means for setting, and the means for using the control signal are collectively arranged on a same semiconductor substrate,
 wherein the first and second frequencies respectively include series and parallel resonant frequencies, wherein the first element means includes an inductive element coupled in series with the resonator, and wherein said means for setting the characteristic of the first element means includes means for setting an inductance of the inductive element to cancel out the series resonant frequency of the resonator, so as to reinforce a tuning effect on the parallel resonant frequency by the second element means in response to the control signal.

19. The system of claim 18, further comprising a wireless device for communicating wireless information, the wireless device including the semiconductor substrate with the amplitude-locked loop means arranged thereon.

20. The system of claim 18 wherein the first element means is responsive to the control signal to tune the first element means to substantially the first frequency.

21. A method for a resonator having first and second frequencies, the method comprising:
 coupling first and second elements to the resonator;
 generating a control signal in an amplitude-locked loop;
 setting a characteristic of the first element to set the first element close to the first frequency to substantially cancel the first frequency; and
 providing the control signal to the second element to adjust tuning of the resonator to the second frequency, wherein the first and second frequencies respectively include series and parallel resonant frequencies, wherein coupling the first element to the resonator includes coupling an inductive element in series with the resonator, and wherein setting the characteristic of the first element includes setting an inductance of the inductive element to cancel out the series resonant frequency of the resonator, so as to reinforce a tuning effect on the parallel resonant frequency by the second element in response to the control signal.

22. A method for a resonator having first and second frequencies, the method comprising:
 coupling first and second elements to the resonator;
 generating a control signal in an amplitude-locked loop;
 setting a characteristic of the first element to set the first element close to the first frequency to substantially cancel the first frequency; and
 providing the control signal to the second element to adjust tuning of the resonator to the second frequency, wherein the first and second frequencies respectively include parallel and series resonant frequencies, wherein coupling the first element to the resonator includes coupling an inductive element in parallel with the resonator, and wherein setting the characteristic of the first element includes setting an inductance of the inductive element to cancel out the parallel resonant frequency of the resonator, so as to reinforce a tuning effect on the series resonant frequency by the second element in response to the control signal.

23. The method of claim 22 further comprising:
 providing a reference signal;
 comparing a reference signal to an output signal to produce an intermediate signal;
 filtering the intermediate signal to produce the control signal; and
 feeding the control signal back to the resonator.

24. The method of claim 22 wherein providing the control signal to the second element includes providing the control signal to a variable capacitive element.

25. The method of claim 22 wherein coupling the first and second elements to the resonator includes coupling said first and second elements to a bulk acoustic wave (BAW)-type resonator on a same silicon semiconductor substrate.

26. The method of claim 21, further comprising:
 providing a reference signal;
 comparing a reference signal to an output signal to produce an intermediate signal;
 filtering the intermediate signal to produce the control signal; and feeding the control signal back to the resonator.

27. The method of claim 21 wherein providing the control signal to the second element includes providing the control signal to a variable capacitive element.

28. The method of claim 21 wherein coupling the first and second elements to the resonator includes coupling said first and second elements to a bulk acoustic wave (BAW)-type resonator on a same silicon semiconductor substrate.

29. The amplitude-locked loop according to claim 1 wherein said partner elements provide said BAW-type resonator with a high quality coefficient.

* * * * *